United States Patent
Buettgen et al.

(10) Patent No.: US 10,418,410 B2
(45) Date of Patent: Sep. 17, 2019

(54) OPTOELECTRONIC MODULES OPERABLE TO COLLECT SPECTRAL DATA AND DISTANCE DATA

(71) Applicant: ams Sensors Singapore Pte. Ltd., Singapore (SG)

(72) Inventors: Bernhard Buettgen, Adliswil (CH); James Eilertsen, Zurich (CH)

(73) Assignee: ams Sensors Singapore Pte. Ltd., Singapore (SG)

(*) Notice: Subject to any disclaimer, the term of this patent is extended or adjusted under 35 U.S.C. 154(b) by 0 days.

(21) Appl. No.: 15/766,103

(22) PCT Filed: Sep. 22, 2016

(86) PCT No.: PCT/SG2016/050465
§ 371 (c)(1),
(2) Date: Apr. 5, 2018

(87) PCT Pub. No.: WO2017/061951
PCT Pub. Date: Apr. 13, 2017

(65) Prior Publication Data
US 2018/0301498 A1    Oct. 18, 2018

Related U.S. Application Data

(60) Provisional application No. 62/239,047, filed on Oct. 8, 2015.

(51) Int. Cl.
*H01L 31/101*    (2006.01)
*G01S 17/10*    (2006.01)
(Continued)

(52) U.S. Cl.
CPC ...... *H01L 27/14647* (2013.01); *G01S 7/4914* (2013.01); *G01S 17/10* (2013.01);
(Continued)

(58) Field of Classification Search
CPC ........... H01L 31/1013; H01L 27/14647; H01L 27/14831; G01S 17/10
See application file for complete search history.

(56) References Cited

U.S. PATENT DOCUMENTS 8,115,158 B2     2/2012   Buettgen
2008/0239466 A1* 10/2008  Buettgen ........... H01L 27/14603
                                                           359/325

(Continued)

FOREIGN PATENT DOCUMENTS

| EP | 2284897 A2 | 2/2011 |
|---|---|---|
| GB | 2486208 A | 6/2012 |
| WO | 2013/104718 | 7/2013 |

OTHER PUBLICATIONS

ISA/AU, International Search Report for PCT/SG2016/050465 (dated Nov. 28, 2016).

*Primary Examiner* — Hoai V Pham
(74) *Attorney, Agent, or Firm* — Fish & Richardson P.C.

(57) ABSTRACT

Optoelectronic modules operable to collect distance data and spectral data include demodulation pixels operable to collect spectral data and distance data via a time-of flight approach. The demodulation pixels include regions with varying charge-carrier mobilities. Multi-wavelength electromagnetic radiation incident on the demodulation pixels are separated into different portions wherein the respective portions are used to determine the composition of the incident multi-wavelength electromagnetic radiation. Accordingly, the optoelectronic module is used, for example, to collect colour images and 3D images, and/or ambient light levels and distance data. The demodulation pixels comprise contact nodes that generate potential regions that vary in magnitude with the lateral dimension of the semiconductor substrate. The potential regions conduct the photo-generated charges from the photo-sensitive detection region to a charge-col- (Continued)

lection region. The photo-generated charges are conducted to the charge-collection region with respective drift velocities that vary in magnitude with the thickness of the semiconductor substrate.

20 Claims, 11 Drawing Sheets

(51) Int. Cl.
    *H01L 27/146*    (2006.01)
    *H01L 27/148*    (2006.01)
    *G01S 7/491*     (2006.01)
    *G01J 3/02*      (2006.01)

(52) U.S. Cl.
    CPC .. *H01L 27/14656* (2013.01); *H01L 27/14831* (2013.01); *H01L 31/1013* (2013.01); *G01J 3/0205* (2013.01)

(56) References Cited

U.S. PATENT DOCUMENTS

| | | |
|---|---|---|
| 2009/0224139 A1 | 9/2009 | Buettgen et al. |
| 2013/0248938 A1 | 9/2013 | Buettgen et al. |

\* cited by examiner

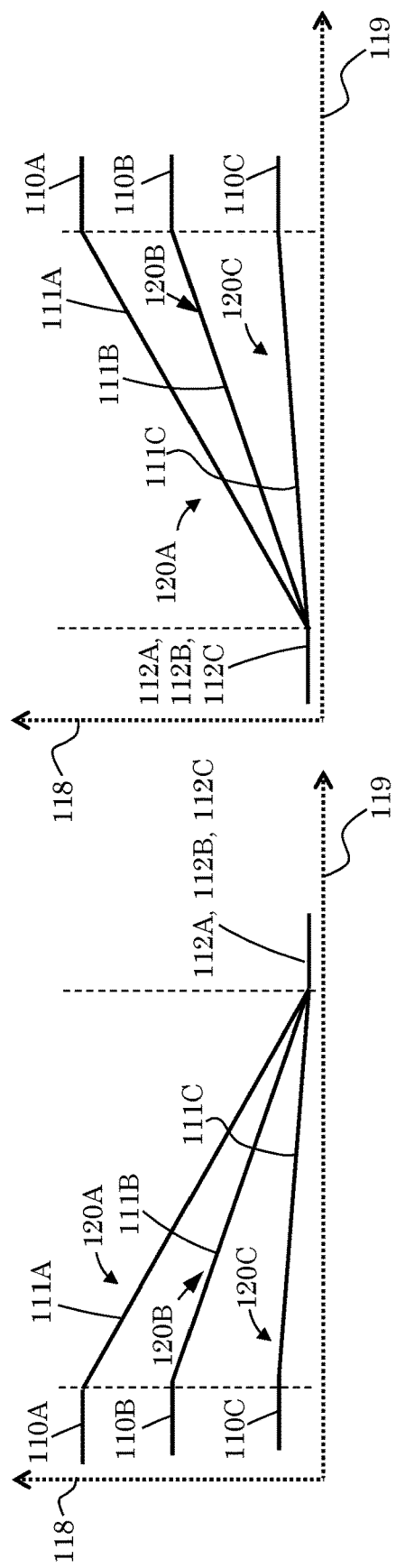

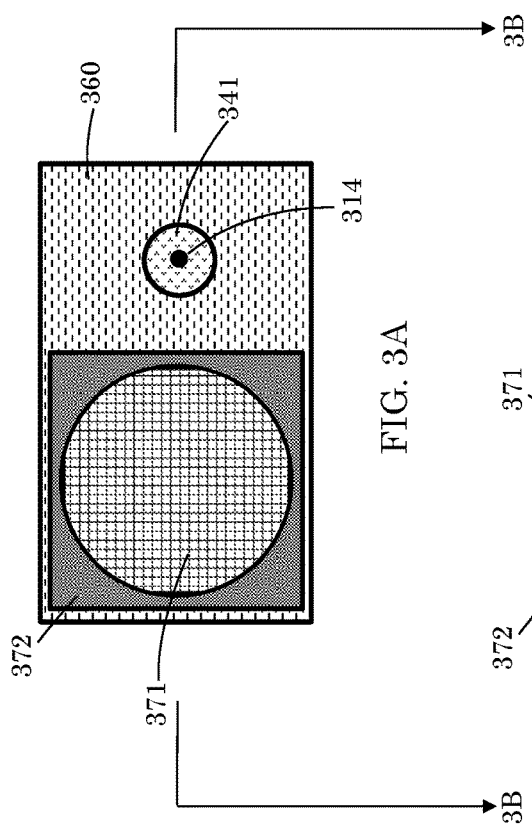
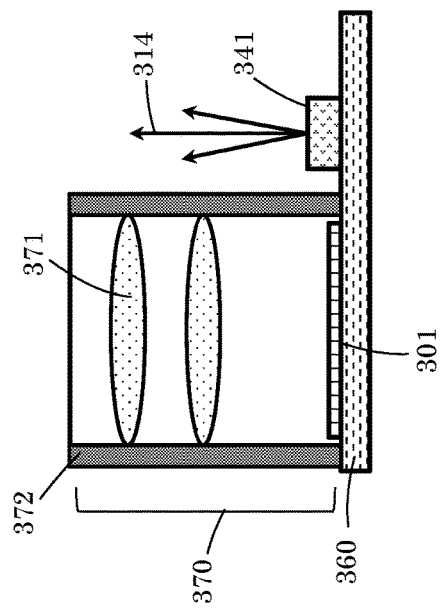
FIG. 3A
FIG. 3B

OPTOELECTRONIC MODULES OPERABLE TO COLLECT SPECTRAL DATA AND DISTANCE DATA

CROSS-REFERENCE TO RELATED APPLICATION(S)

This application is the National Stage of International Application No. PCT/SG2016/050465, filed on Sep. 22, 2016, which claims the benefit of priority U.S. Application No. 62/028,893, filed on Jul. 25, 2014 and U.S. Application No. 62/239,047, filed on Oct. 8, 2015. The disclosure of the prior applications is incorporated herein by reference.

TECHNICAL FIELD

The present disclosure relates to optoelectronic modules including demodulation pixels. The optoelectronic modules can be operable to acquire both spectral data and distance data.

BACKGROUND

Demodulation pixels are well known in the field of contactless distance measurement, proximity detection, and multi-dimensional imaging; for example, demodulation pixels can be employed in time-of-flight techniques. In some cases, time-of-flight distance measurements or other distance measurements, proximity detection and/or multi-dimensional imaging require a modulated light source and at least one demodulation pixel. Modulated light incident on a multi-dimensional object or scene can be reflected from an object and captured by a demodulation pixel or demodulation pixel array. The captured light can be converted into a signal, wherein collected-light amplitude and distance information/data is extracted from the demodulated signal; for example, via the phase shift of the captured light.

Distance measurements, proximity detection, and multi-dimensional imaging data are sometimes combined with spectral data of an object or scene. However, as demodulation pixels are dedicated to the acquisition of distance data, they typically are combined with separate pixels or a separate pixel array configured specifically for the acquisition of spectral data (i.e., pixels configured to detect intensity values only). Accordingly, such a pixel or pixel array must be combined with a corresponding spectral filter or filter array, respectively, in order to acquire spectral data.

Consequently, the two types of pixels (i.e., demodulation pixel/pixel array and intensity pixel/pixel array) must be incorporated into the same optoelectronic device in order to collect both distance data and spectral data where additional lateral space must be afforded to these two types of pixels. However, in order to reduce the footprint of optoelectronic devices/modules capable of acquiring both distance data and spectral data the two functions (i.e., acquisition of distance data and spectral data) must be incorporated into the same pixel or pixel array.

SUMMARY

The present disclosure describes optoelectronic modules operable to capture both distance data and spectral data via a demodulation pixel and/or an array of demodulation pixels. In one aspect, for example, an optoelectronic module is operable to capture distance and spectral data, and includes a demodulation pixel (for example, a drift-field demodulation pixel). The demodulation pixel has a photo-sensitive detection region, gates, an insulator layer, a semiconductor substrate with a thickness and lateral dimension, a charge-collection region, and contact nodes. Potentials can be applied to the contact nodes so as to generate potential regions varying in magnitude with the lateral dimension of the semiconductor substrate. In such implementations, the optoelectronic module is operable to generate photo-generated charges from multi-wavelength electromagnetic radiation incident on the photo-sensitive detection region, wherein respective portions of the multi-wavelength electromagnetic radiation incident on the photo-sensitive detection region generate respective corresponding portions of the photo-generated charges. Further, in such implementations the potential regions within the semiconductor substrate are operable to conduct the photo-generated charges from the photo-sensitive detection region to the charge-collection region. Further in such implementations the respective portions of the photo-generated charges are respectively conducted to the charge-collection region with respective drift velocities that respectively vary in magnitude with the thickness of the semiconductor substrate.

In another aspect, for example, an optoelectronic module is operable to capture distance and spectral data, and includes a demodulation pixel (for example, a drift-field demodulation pixel). The drift-field demodulation pixel has a photo-sensitive detection region, gates, an insulator layer, a semiconductor substrate with a thickness and lateral dimension, a charge-collection region, and contact nodes. Potentials can be applied to the contact nodes so as to generate potential regions varying in magnitude with the lateral dimension of the semiconductor substrate, the potential regions further varying in magnitude with the thickness of the semiconductor substrate. In such an implementation the optoelectronic module is operable to generate photo-generated charges from multi-wavelength electromagnetic radiation incident on the photo-sensitive detection region, wherein respective portions of the multi-wavelength electromagnetic radiation incident on the photo-sensitive detection region generate respective corresponding portions of the photo-generated charges. Further, in such an implementation, the potential regions within the semiconductor substrate are operable to conduct the photo-generated charges from the photo-sensitive detection region to the charge-collection region. Still further, in such implementations, the respective portions of the photo-generated charges are respectively conducted to the charge-collection region with respective drift velocities that respectively vary in magnitude with the thickness of the semiconductor substrate.

In some implementations, the semiconductor substrate can include mobility regions that permit a respective plurality of charge-carrier mobilities.

In some implementations, the mobility regions are distributed along the thickness of the semiconductor substrate such that the charge-carrier mobility of the semiconductor substrate varies along the thickness of the semiconductor substrate.

In some implementations, the respective portions of photo-generated charges are sampled at the output nodes with respective sampling period profiles; accordingly, spectral data and distance data can be collected.

In the following description, reference is made to the accompanying drawings that form a part hereof, and in which is shown by way of illustration specific embodiments which may be practiced. These embodiments are described in sufficient detail to enable those skilled in the art to practice the invention; other embodiments may be utilized and that structural changes may be made without departing from the scope of the present invention. The following description of example embodiments is, therefore, not to be taken in a limiting sense, and the scope of the present invention is defined by the appended claims. Other aspects, features and advantages will be apparent from the detailed description, the accompanying drawings, and the claims.

BRIEF DESCRIPTION OF THE DRAWINGS

FIG. 1E and FIG. 1F depict an example of a modulated potential diagrams for sampling spectral data with the optoelectronic module depicted in FIG. 1A and FIG. 1B.

FIG. 3A depicts a plan view of an example optoelectronic module for the acquisition of an optoelectronic module operable to acquire both distance data and spectral data including an example of an emitter.

FIG. 3B depicts a cross-sectional view of the example optoelectronic module depicted in FIG. 3A for the acquisition of an optoelectronic module operable to acquire both distance data and spectral data including an example of an emitter.

DETAILED DESCRIPTION

The various implementations described in this disclosure exploit spatially varying charge-carrier drift velocities in a drift-field demodulation pixel in order to acquire spectral data. Charge-carrier drift velocities can be described according to the following:

$$v_d = \mu \times E$$

where $v_d$ is charge-carrier drift velocity, $\mu$ is charge-carrier mobility, and E is an electric drift field. Accordingly, spatially varying drift fields and charge-carrier mobilities can be used to acquire spectral data. In some implementations, spatially varying drift-fields can be used to acquire spectral data as illustrated in the accompanying figures.

Figure 1A:
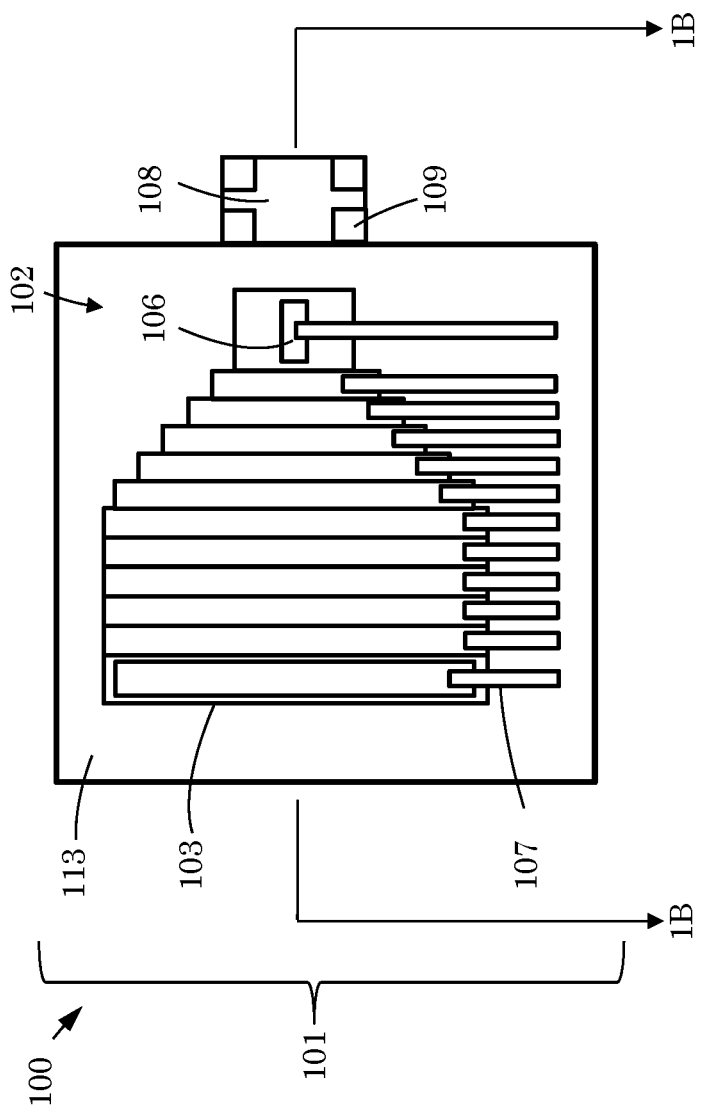
FIG. 1A depicts a plan view of an example of an optoelectronic module operable to acquire both distance data and spectral data.

FIG. 1A depicts a plan view of an example of an optoelectronic module 100 operable to acquire both distance data and spectral data. The optoelectronic module 100 includes a drift-field demodulation pixel 101 and, in some implementations, can further include a spectral filter 113. In other implementations the optoelectronic module 100 can include an array of demodulation pixels 101. The drift-field demodulation pixel 101 further includes a photo-sensitive detection region 102. In this implementation the drift-field demodulation pixel 101 further includes a plurality of gates 103, and insulator layer 104, a semiconductor substrate 105, and a plurality of contact nodes 106.

The semiconductor substrate 105 has a thickness t and a lateral dimension l. In some cases, the lateral dimension l can be considerably larger in magnitude than the thickness t. The semiconductor substrate 105 can be composed of silicon, for example, and can be further doped with appropriate dopants. However, other semiconductors materials can be used in some implementations. For example, in some implementations, semiconductor substrate 105 can be derived from the Group 13-Group 17 elements (and/or combinations thereof) in order to achieve, for example, particular charge-carrier concentrations, spectral sensitivities, and/or charge-carrier mobilities. Still further, semiconductor substrate 105 can be single crystalline, polycrystalline, and/or a crystalline and/or polycrystalline nanocomposite. Further, in this implementation, each respective gate within the plurality of gates 103 can be adjacent and electrically isolated from each other.

Potentials (e.g., voltages) 118X can be applied to the plurality of contact nodes 106 via electrodes 107. The applied potentials 118X can generate a plurality of potential regions 110X within the semiconductor substrate 105; that is, a plurality of respective drift-field regions each of a respective magnitude each spanning a lateral dimension l of the semiconductor substrate 105. The drift-field demodulation pixel 101 further includes a charge-collection region 108 (e.g., a charge demodulation region) and a plurality of output nodes 109. Multi-wavelength electromagnetic radiation 114 can be incident on the drift-field demodulation pixel 101. Multi-wavelength electromagnetic radiation 114 can be generated by an emitter (e.g., an emitter implemented in coordination with and/or as part of the optoelectronic module 100 such as a modulated light source and/or a flash and/or a modulated flash); however, in other implementations multi-wavelength electromagnetic radiation 114 can be generated by ambient light (e.g., natural or artificial lighting in a scene). The multi-wavelength electromagnetic radiation 114 can be any composition of wavelengths (e.g., from infrared to visible to ultraviolet).

In some implementations optoelectronic module 100 further includes a spectral filter 113. The spectral filter 113 can be useful in some cases to block or substantially attenuate particular ranges of wavelengths of electromagnetic radiation. For example, in some implementations infrared radiation may be blocked or substantially attenuated, while in other implementations ultraviolet radiation may be blocked or substantially attenuated. The multi-wavelength electromagnetic radiation 114 incident on the drift-field demodulation pixel 101, and consequently, the photo-sensitive detection region 102 can generate a plurality of photo-generated charges 115 in the semiconductor substrate 105.

In some implementations each potential region among the potential regions 110X can vary with the thickness t and/or the lateral dimension l of the semiconductor substrate 105.

For example, a potential region can have a constant magnitude at a particular depth in the semiconductor substrate 105 over a particular length of the lateral dimension l. While in other instances, a potential region can have a linearly varying and/or polynomially varying magnitude over a particular length of the lateral dimension l and can also vary with the thickness t of the semiconductor substrate. Other variations are possible. Accordingly, a plurality of potential profiles can be depicted as in FIG. 1B that intersect the respective aforementioned potential regions.

Figure 1B:
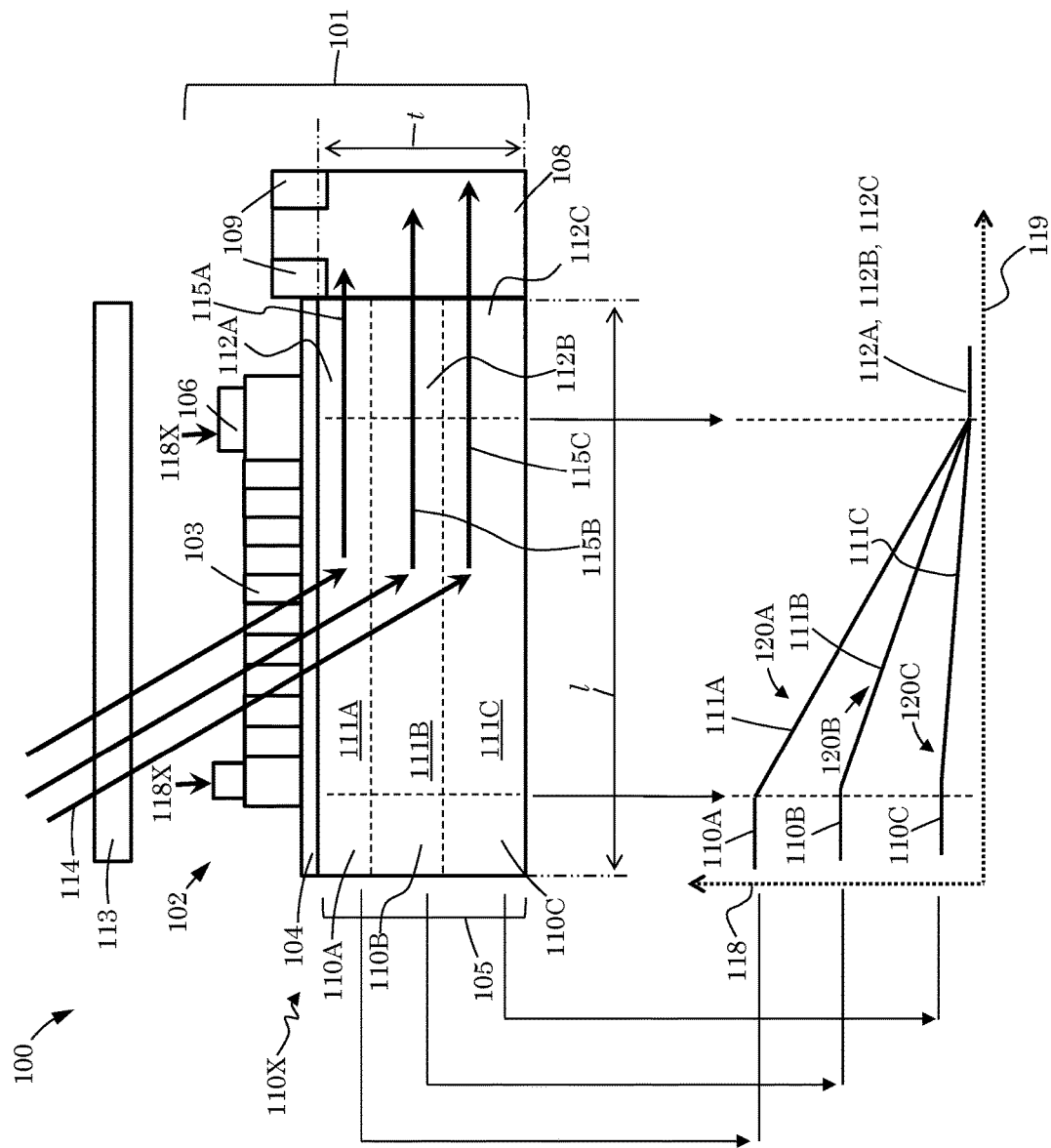
FIG. 1B depicts a cross-sectional view of the example optoelectronic module depicted in FIG. 1A and a plurality of drift-field potential regions for the acquisition of spectral data.

A discrete number of potential profiles are depicted in FIG. 1B for clarity; since, for example, in some implementations a near infinite number of potential profiles exists (e.g., when the magnitude of a potential region varies continuously with thickness t). Each potential profile depicted in FIG. 1B can be taken as a pathway bisecting the semiconductor substrate 105 at a particular thickness (i.e., at a particular depth from the photo-sensitive detection region 102) and intersecting the respective potential regions. Accordingly, each potential profile depicted can include differing drift-field characteristics over the lateral dimension l of the semiconductor substrate 105 over which each potential profile spans. Consequently, respective photo-generated charges (i.e., photo-generated charges that are generated at a particular depth corresponding to a respective potential profile) can be conducted along the lateral dimension l of the semiconductor substrate 105 according to a respective potential profile. For example, some potential profiles can permit respective photo-generated charges to travel with a large drift velocity, while other potential profiles can permit respective photo-generated charges to travel with a small drift velocity. The potentials 118X, the arrangement of the plurality of contact nodes 106, the plurality of gates 103, the insulator layer 104, the semiconductor substrate 105, and/or the doping of any of the aforementioned can be configured to generate a plurality of potential regions (i.e., regions within the semiconductor substrate 105 with respective drift fields) and, accordingly, can generate potential profiles having any number of characteristic profiles. For example, the respective potential profiles can vary linearly with the lateral dimension l, or in any other way. As described above, the plurality of potential profiles depicted in FIG. 1B can vary with the lateral dimension l as depicted in FIG. 1B (i.e., where three discrete potential profiles are depicted). Further as mentioned above, although three discrete potential profile are depicted in FIG. 1B, the plurality of potential profiles can be distributed continuously; that is the plurality can include a non-finite number of potential profiles. However, for clarity of the disclosure, only three discrete potential profiles are depicted.

FIG. 1B depicts a cross-sectional view of the example optoelectronic module depicted in FIG. 1A and a plurality of potential profiles for the acquisition of spectral data. As mentioned above the potential profiles 120, as depicted in FIG. 1B, are depicted as discrete potential profiles; however, the potential profiles need not be discrete (as described above), but are presented in this fashion for clarity. Accordingly, the plurality of potential profiles 120 includes a first potential profile 120A, a second potential profile 120B, and a third potential profile 120C, wherein each first, second, and third potential profile can span the lateral dimension l of the semiconductor substrate 105 laterally. More or fewer discrete potential profiles can be included in other implementations. Moreover, as mentioned above, the potential profiles need not include discrete potential profiles, but rather can include a continuous distribution and/or essentially non-finite number of potential profiles.

As mentioned above, the applied potentials 118X can generate a plurality of potential regions 110X where the drift field within the semiconductor substrate 105 can vary laterally with the lateral dimension l of the semiconductor substrate 105. For example, the plurality of potential region 110X can include a high-potential region 110, a drift-field potential region 111, and a low-potential region 112. Further, since the drift-field can also vary with the thickness t of the semiconductor substrate 105 (as depicted in FIG. 1B by the plurality of potential profiles 120 which includes the first potential profile 120A, the second potential profile 120B, and the third potential profile 120C) the plurality of potential regions 110X can further include a plurality of potential regions that vary along the thickness t of the semiconductor substrate 105. Therefore the plurality of potential regions 110X can further include a plurality of respective potential regions that are intersected by the plurality of potential profiles 120 (i.e., the potential profile 120A, the potential profile 120B, and the potential profile 120C). For example, in this implementation the first potential profile 120A can span laterally (or intersect) the first high-potential region 110A, a first drift-field region 111A, and a first low-potential region 112A. Likewise, the second potential profile 120B can span laterally (or intersect) a second high-potential region 110B, a second drift-field region 111B, and a second low-potential region 112B. Further the third potential profile 120C can span laterally (or intersect) a third high-potential region 110C, a third drift-field region 111C, and a third low-potential region 112C.

Generally, the potential regions 110X can facilitate the conduction of the photo-generated charges 115 into the charge-collection region 108 so that a signal can be sampled at the output nodes 109 (e.g., where in some cases the sample can be demodulated at the charge-collection region 108). Further, the potential regions 110X can dump the photo-generated charges 115 when it becomes necessary to drain excess or unwanted charge from the drift-field demodulation pixel 101.

In some implementations the potential profile 120A, potential profile 120B and potential profile 120C vary with thickness t of the semiconductor substrate 105, and different wavelengths within the multi-wavelength electromagnetic radiation 114 incident on the photo-sensitive detection region 102 can penetrate the semiconductor substrate 105 to different depths. In such cases, the photo-generated charges 115 generated at different depths can be associated with different portions of the multi-wavelength electromagnetic radiation 114. Accordingly, since the potential profiles 120 are distributed over a range of depths in this implementation, then the photo-generated charges 115 generated at different depths can have respective drift velocities. For example, in the implementation depicted in FIG. 1B, different portions of the multi-wavelength electromagnetic radiation 114 can penetrate the semiconductor substrate 105 to different depths (e.g., ranges of wavelengths of the multi-wavelength electromagnetic radiation 114 primarily corresponding to red light can penetrate to the third drift-field region 111C, ranges of wavelengths of the multi-wavelength electromagnetic radiation 114 primarily corresponding to green light can penetrate to the second drift-field region 111B, and ranges of wavelengths of the multi-wavelength electromagnetic radiation 114 primarily corresponding to blue light can penetrate to the first drift-field region 111A). Accordingly, first photo-generated charges 115A, second photo-generated charges 115B, and third photo-generated charge 115C can primarily correspond to respective portions of the multi-wavelength electromagnetic radiation 114, respectively blue, green, and red in this example.

Still further, as each of the first photo-generated charges 115A, each of the second photo-generated charges 115B, and each of the third photo-generated charges 115C is subjected to respective potential profiles 120A, 120B, and 120C, then each has a respective drift velocity 116A, 116B, and 116C dictated in part by the respective potential profiles 120A, 120B, and 120C. Since the photo-generated charges 115A, 115B, 115C have respective drift velocities, and in this implementation each respective drift velocity is different, then the photo-generated charges 115A, 115B, and 115C will arrive at the charge-collection region 108 at different points in time. Accordingly, signals, each associated with the respective photo-generated charges 115A, 115B, and 115C can be sampled at different times and can be associated with the different portions of the multi-wavelength electromagnetic radiation 114 incident on the photo-sensitive detection region 102. Consequently, spectral data such as the composition of the multi-wavelength electromagnetic radiation 114 can be determined (e.g., the wavelengths and/or wavelength ranges and their respective intensities can be determined).

The lower part of FIG. 1B depicts a potential or drift-field magnitude 118 on the y-axis and a lateral dimension or coordinate 119 on the x-axis of a plot depicting the first potential profile 120A, second potential profile 120B, and third potential profile 120C. As depicted, the first potential profile 120A varied from a high potential to a low potential (from left to right). The second potential profile 120B and the third potential profile 120C vary in a similar way. Moreover, the potential regions 110X are also depicted. The potential regions 110C include the first high-potential region 110A, the second high-potential region 110B, the third high-potential region 110C, the first drift-field region 111A, the second drift-field region 111B, the third drift-field region 111C, the first low-potential region 112A, the second low-potential region 112B, and the third low-potential region 112C.

Figure 1C:
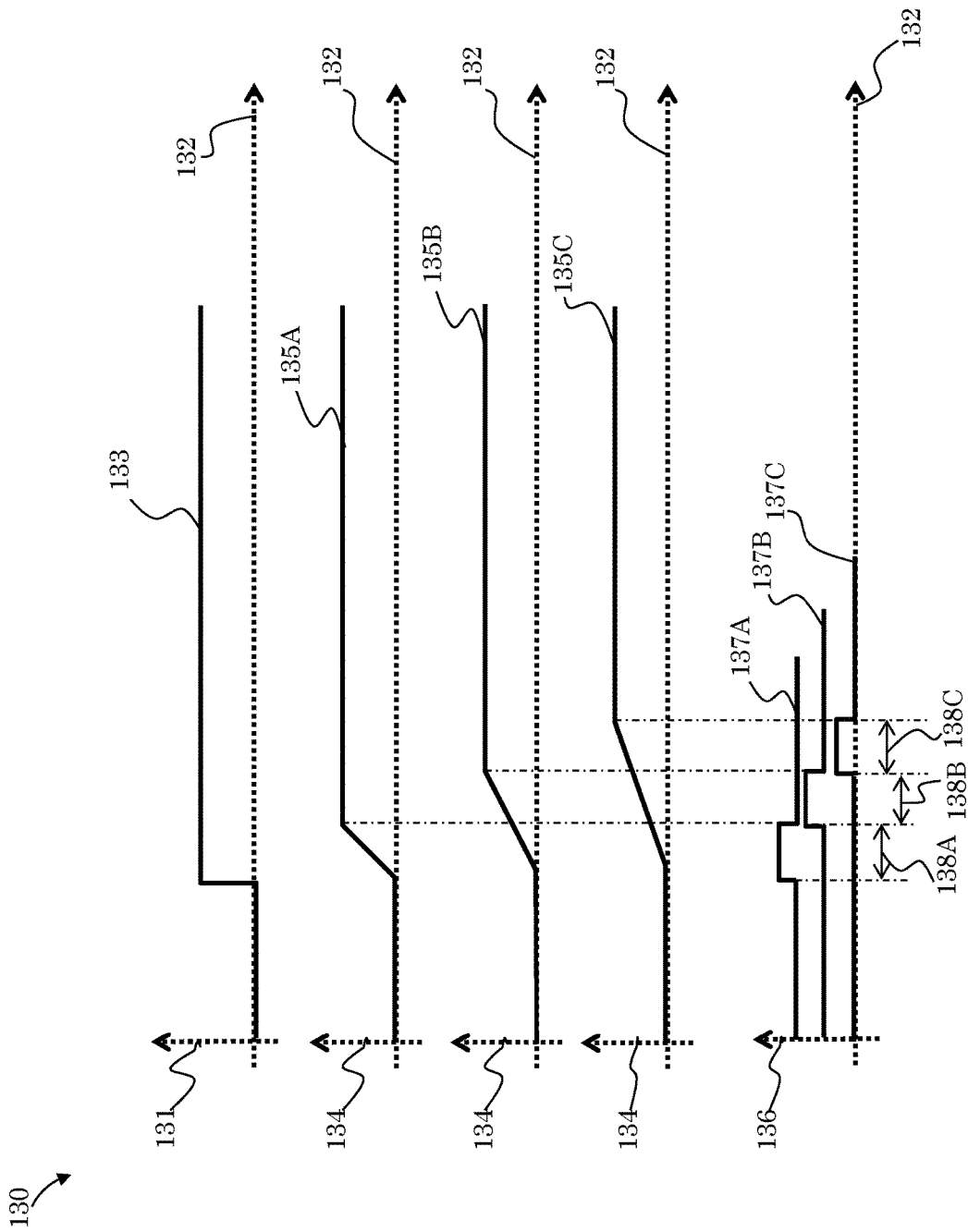
FIG. 1C depicts an example of a timing diagram for sampling spectral data with the optoelectronic module depicted in FIGS. 1A and 1B.

FIG. 1C depicts an example of a timing diagram for sampling spectral data with the optoelectronic module depicted in FIG. 1A and FIG. 1B. The timing diagram 130 depicts a light source power or intensity 131 on the y-axis and a time 132 on the x-axis of a plot depicting a multi-wavelength light source profile 133. In this example, the multi-wavelength light source profile 133 represents the intensity of the multi-wavelength electromagnetic radiation 114 incident on the photo-sensitive detection region 102 with a constant or substantially constant intensity. In other implementation, the multi-wavelength light source profile 133 can represent the power supplied to an emitter associated or incorporated into the optoelectronic module 100, in which case the power to such an emitter would be constant (as depicted by multi-wavelength light source profile 133).

The timing diagram 130 further depicts a photo-current magnitude 134 on the y-axis and time 132 on the x-axis of a plot depicting a first photo-current profile 135A. The first photo-current profile 135A corresponds to the first photo-generated charges 115A under the influence of the first potential profile 120A with a respective drift velocity depicted in FIG. 1B. The timing diagram 130 further depicts a second photo-current profile 135B. The second photo-current profile 135B corresponds to the second photo-generated charges 115B under the influence of the second potential profile 120B with a respective drift velocity depicted in FIG. 1B. Still further, the timing diagram 130 further depicts a third photo-current profile 135C. The third photo-current profile 135C corresponds to the third photo-generated charges 115C under the influence of the third potential profile 120C with a respective drift velocity depicted in FIG. 1B. The timing diagram 130 also depicts a digital logic level 136 on the y-axis and time 132 on the x-axis of a plot depicting a first sampling period profile 137A, a second sampling period profile 137B, and a third sampling period profile 137C. Each sampling period profile 137A, 137B, and 137C corresponds to the respective first photo-current profile 135A, second photo-current profile 135B, and third photo-current profile 135C. Further, each sampling period profile 137A, 137B, and 137C has a corresponding first sampling period 138A, second sampling period 138B, and third sampling period 138C, respectively. Each first sampling period 138A, second sampling period 138B, and third sampling period 138C can be of the same or different duration.

The timing diagram 130 depicted in FIG. 1C illustrates an example of how spectral data can be sampled given multi-wavelength electromagnetic radiation 114 incident on the photo-sensitive detection region 102 of a particular characteristic. In this example, the multi-wavelength electromagnetic radiation 114, as represented by multi-wavelength light source profile 133 is substantially uniform in intensity (or power as discussed above) over the depicted duration. Accordingly, as the respective drift velocities associated with each of the first photo-generated charges 115A, second photo-generated charges 115B, and third photo-generated charges 115C is different in this example, though each plurality 115A, 115B, 115C travels substantially the same average lateral distance l, then the first sampling period 138A, second sampling period 138B, and third sampling period 138C can be configured to sample the plurality of photo-generated charges 115A, 115B, and 115C at the charge-collection region 108 via the output nodes 109 such that each respective sampling period 138A, 138B, and 138C captures a portion of the respective plurality of photo-generated charges 115A, 115B and 115C that can be subsequently used to determine spectral data (i.e., composition of the multi-wavelength electromagnetic radiation 114 incident on the photo-sensitive detection region 102).

In some implementation the sampling periods 138A, 138B, and 138C occur within a time period characterized by respective non-steady first photo-current profile 135A, second photo-current profile 135B, and third photo-current profile 135C. For example, during the first sampling period 138A, the first photo-current profile 135A is non steady; further during the second sampling period 138B, the second photo-current profile 135B is non-steady; and still further during the third sampling period 138C, the third photo-current profile 135C is non-steady. Consequently, the sampled signals collected over the three respective sampling periods 138A, 138B, and 138C can collectively be used to determine spectral data (e.g., via an external processor).

As mentioned above, in the example implementation depicted in FIG. 1A and FIG. 1B each drift velocity associated with each respective plurality of photo-generated charges 115A, plurality of photo-generated charges 115B, and plurality of photo-generated charges 115C (corresponding to the first photo-current profile 135A, the second photo-current profile 135B, and the third photo-current profile 135C, respectively) can be different. For example, the drift velocity associated with the first photo-generated charges 115A can be greater than the drift velocity associated with the second photo-generated charges 115B, and the drift velocity associated with the plurality of second photo-generated charges 115B can be greater than the drift velocity associated with the third photo-generated charges 115C. Accordingly, a first sampling initiation time (i.e., the time at which the first sampling period 138A commences) can be determined since the average distance each respective plurality of photo-generated charges 115A, 115B, and 115C travels is substantially the same (e.g., the lateral dimension l of the semiconductor substrate 105). In some implementations, therefore, the first sampling initiation time is substantially similar to the lateral dimension l of the semiconductor substrate divided by the first drift velocity.

Generally, the first sampling initiation time commences after the initial generation of photo-generated charges 115A by the incident multi-wavelength electromagnetic radiation 114. In a similar manner, a second sampling initiation time can be substantially similar to the lateral dimension of the semiconductor substrate divided by the second drift velocity, where the second sampling initiation time also commences after the initial generation of photo-generated charges 115B by the incident multi-wavelength electromagnetic radiation 114. Further, in a similar manner a third sampling initiation time can be substantially similar to the lateral dimension l of the semiconductor substrate 105 divided by the third drift velocity, where the third sampling initiation time also commences after the initial generation of photo-generated charges 115C by the incident multi-wavelength electromagnetic radiation 114. In some implementations, for example when the generation of 115A, 115B, and 115C is substantially simultaneous, the first sampling period 138A can be substantially similar to the absolute value of the second sampling initiation time minus the first sampling initiation time. Further, in such implementations the second sampling period 138B can be substantially similar to the absolute value of the third sampling initiation time minus the second sampling initiation time. Still further, in such implementations the third sampling period 138C can be equal to the duration of time necessary for a steady state third photo-current profile 135C to be achieved.

Figure 1D:
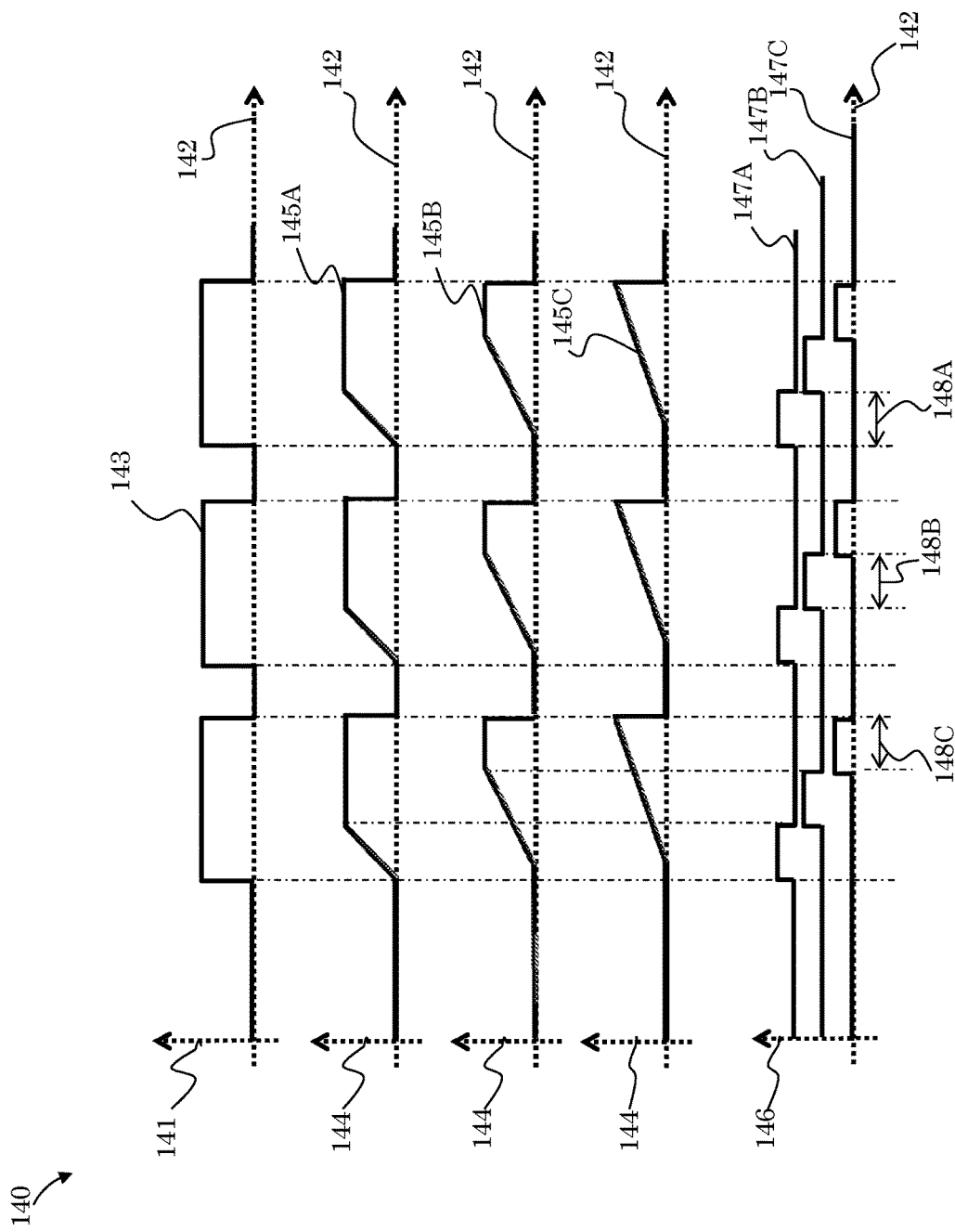
FIG. 1D depicts yet another example of a timing diagram for sampling spectral data with the optoelectronic module depicted in FIGS. 1A and 1B.

FIG. 1D depicts yet another example of a timing diagram for sampling spectral data with the optoelectronic module depicted in FIG. 1A and FIG. 1B. The timing diagram 140 depicts a light source power or intensity 141 on the y-axis and a time 142 on the x-axis of a plot depicting a multi-wavelength light source profile 143. In this example, the multi-wavelength light source profile 143 represents the intensity of the multi-wavelength electromagnetic radiation 114 incident on the photo-sensitive detection region 102 with a modulated intensity. In other implementation, the multi-wavelength light source profile 143 can represent the power supplied to an emitter associated or incorporated into the optoelectronic module 100, in which case the power to such an emitter would be modulated (as depicted by multi-wavelength light source profile 143).

The timing diagram 140 further depicts a photo-current magnitude 144 on the y-axis and time 142 on the x-axis of a plot depicting a first photo-current profile 145A. The first photo-current profile 145A corresponds to the first photo-generated charges 115A under the influence of the first potential profile 120A with a respective drift velocity depicted in FIG. 1B. The timing diagram 140 further depicts a second photo-current profile 145B. The second photo-current profile 145B corresponds to the second photo-generated charges 115B under the influence of the second potential profile 120B with a respective drift velocity depicted in FIG. 1B. Still further, the timing diagram 140 depicts a third photo-current profile 145C. The third photo-current profile 145C corresponds to the third photo-generated charge 115C under the influence of the third potential profile 120C with a respective drift velocity depicted in FIG. 1B. The timing diagram 140 also depicts a digital logic level 146 on the y-axis and time 142 on the x-axis of a plot depicting a first sampling period profile 147A, a second sampling period profile 147B, and a third sampling period profile 147C. Each sampling period profile 147A, 147B, and 147C corresponds to the respective first photo-current profile 145A, second photo-current profile 145B, and third photo-current profile 145C. Further, each sampling period profile 147A, 147B, and 147C has a corresponding first sampling period 148A, second sampling period 148B, and third sampling period 148C, respectively. Each first sampling period 148A, second sampling period 148B, and third sampling period 148C can be of the same or different duration.

The timing diagram 140 depicted in FIG. 1D illustrates an example of how spectral data can be sampled given multi-wavelength electromagnetic radiation 114 incident on the photo-sensitive detection region 102 of a particular characteristic. In this example, the multi-wavelength electromagnetic radiation 114, as represented by multi-wavelength light source profile 143 is substantially modulated in intensity (or power as discussed above) over the depicted duration. The multi-wavelength modulated light source profile 143 is modulated with a particular modulation frequency. The modulation frequency can depend on, for example, the intended application of the optoelectronic module 100. Further, the modulation frequency can be tuned for a particular application mode. For example, for spectral data acquisition, the modulation frequency can be of a first modulation frequency, while for a distance data acquisition mode, the modulation frequency can be a second modulation frequency. The selection of a particular modulation frequency (e.g., for spectral and/or distance data acquisition) is within the acumen of a person of ordinary skill in the art to which this disclosure pertains.

Accordingly, although the multi-wavelength modulated light source profile 143 is modulated, the respective drift velocities associated with each of the first photo-generated charges 115A, second photo-generated charges 115B, and photo-generated charges 115C, are different in this example. Further, as in the implementation depicted in FIG. 1D, since each plurality of photo-generated charges 115A, 115B, 115C travels substantially the same average lateral distance l, then the first sampling period 148A, second sampling period 148B, and third sampling period 148C can be configured to sample the photo-generated charges 115A, 115B, and 115C at the charge-collection region 108 via the output nodes 109 such that each respective sampling period 148A, 148B, and 148C captures a portion of the respective plurality of photo-generated charges 115A, 115B, and 115C that can be subsequently used to determine spectral data (i.e., composition of the multi-wavelength electromagnetic radiation 114 incident on the photo-sensitive detection region 102). In some implementation the sampling periods 148A, 148B, and 148C occur within a time period characterized by respective non-steady first photo-current profile 145A, second photo-current profile 145B, and third photo-current profile 145C. For example, during the first sampling period 148A, the first photo-current profile 145A is non-steady; further during the second sampling period 148B, the second photo-current profile 145B is non-steady; and still further during the third sampling period 148C, the third photo-current profile 145C is non-steady. Consequently, the sampled signals collected over the three respective sampling periods 148A, 148B, and 148C can collectively be used to determine spectral data (e.g., via an external processor). Since the multi-wavelength modulated light source profile 143 is modulated the non-steady portions of each first photo-current profile 145A, second photo-current profile 145B, and third photo-current profile 145C repeat substantially corresponding to the modulation frequency of the multi-wavelength electromagnetic radiation 114 (as represented by the multi-wavelength modulated light source profile 143).

As mentioned above, in the example implementation depicted in FIG. 1A-FIG. 1C each drift velocity associated with the photo-generated charges 115A, the photo-generated charges 115B, and the photo-generated charges 115C (corresponding to the first photo-current profile 145A, the second photo-current profile 145B, and the third photo-current profile 145C, respectively) can be different. For example, the drift velocity associated with the first photo-generated charges 115A can be greater than the drift velocity associated with the second photo-generated charges 115B, and the drift velocity associated with the second photo-generated charges 115B can be greater than the drift velocity associated with the third photo-generated charges 115C. Accordingly, a first sampling initiation time (i.e., the time at which the first sampling period 148A commences) can be determined since the average distance each respective plurality of photo-generated charges 115A, 115B, and 115C travels is substantially the same (e.g., the lateral dimension l of the semiconductor substrate 105). In some implementations, therefore, the first sampling initiation time is substantially similar to the lateral dimension l of the semiconductor substrate divided by the first drift velocity.

Generally, the first sampling initiation time commences after the initial generation of photo-generated charges 115A by the incident multi-wavelength electromagnetic radiation 114. In a similar manner a second sampling initiation time can be substantially similar to (e.g., equal to) the lateral dimension of the semiconductor substrate divided by the second drift velocity, where the second sampling initiation time also commences after the initial generation of photo-generated charges 115B by the incident multi-wavelength electromagnetic radiation 114. Further, in a similar manner, a third sampling initiation time can be substantially similar to (e.g., equal to) the lateral dimension l of the semiconductor substrate 105 divided by the third drift velocity, where the third sampling initiation time also commences after the initial generation of photo-generated charges 115C by the incident multi-wavelength electromagnetic radiation 114. In some implementations, for example when the generation of 115A, 115B, and 115C is substantially simultaneous, the first sampling period 148A can be substantially similar to (e.g., equal to) the absolute value of the second sampling initiation time minus the first sampling initiation time. Further, in such implementations the second sampling period 148B can be substantially similar to (e.g., equal to) the absolute value of the third sampling initiation time minus the second sampling initiation time. Still further, in such implementations the third sampling period 148C can be equal to the duration of time necessary for a steady state third photo-current profile 145C to be achieved.

Further, in this implementation, each first sampling period profile 147A, second sampling period profile 147B, and third sampling period profile 147C can be characterized by a frequency. The frequency can be substantially the same as the modulation frequency of the multi-wavelength electromagnetic radiation 114 incident on the photo-sensitive detection region 102 as represented by multi-wavelength modulated light source profile 143. In general, when the multi-wavelength electromagnetic radiation 114 incident on the photo-sensitive detection region 102 is modulated, additional charge (e.g., the respective plurality of photo-generated charges 115A, 115B, and 115C) can be collected in the charge-collection region 108 and sampled via the output nodes 109. This can be an advantage in some cases, for example, the additional charge can provide for a more sensitive and/or more accurate acquisition of spectral data. Further, in other instances, the respective plurality of photo-generated charges 115A, 115B, and 115C can provide distance data.

In some implementations, both distance data and spectral data can be acquired simultaneously or substantially simultaneously. It should be noted further that other approaches to optimize the accuracy and/or sensitivity of the sampled signal are within the scope of the claims; the examples above are intended to be non-limiting. For example, another implementation within the scope of this disclosure includes operating the potentials 118X such that the plurality of potential profiles 120 and/or plurality of potential regions 110X drain away photo-generated charges from the semiconductor substrate 105 at various points in time while the signal is being sampled. Operation of the optoelectronic module 100 in this way can improve accuracy and/or sensitivity of the sampled signal and/or remove or reduce artifacts (such as artifacts of previous measurements). An example of the aforementioned is depicted in FIG. 1E and FIG. 1F.

FIG. 1E and FIG. 1F depict an example of a modulated potential profile diagram for sampling spectral data with the optoelectronic module depicted in FIG. 1A and FIG. 1B. FIG. 1E depicts a potential or drift-field magnitude 118 on the y-axis and a lateral dimension or coordinate 119 on the x-axis of a plot depicting the first potential profile 120A, second potential profile 120B, and third potential profile 120C. As depicted, the first potential profile 120A varies from a high potential to a low potential (from left to right). The second potential profile 120B and the third potential profile 120C vary in a similar way. Note, however, that in FIG. 1F the potential profiles 120A, 120B, and 120C vary in a direction opposite the potential profiles 120A, 120B, and 120C depicted in FIG. 1E. The potential profiles 120A, 120B, 120C depicted in FIG. 1E can be useful to conduct photo-generated charges (e.g., 115A, 115B, 115C) into the charge-collection region 108; however, the potential profiles 120A, 120B, 120C depicted in FIG. 1F can be useful to conduct photo-generated charges (e.g., 115A, 115B, 115C) into a drain or charge dump area. The two figures are example of potential profiles as distributed over the semiconductor substrate 105 and are intended to be non-limiting. Advantages of dumping or draining photo-generated charges from the semiconductor substrate 105 were discussed above. Further, the example potential profiles depicted in FIG. 1E and FIG. 1F can be implemented in the following example as well (depicted in FIG. 1G).

Figure 1G:
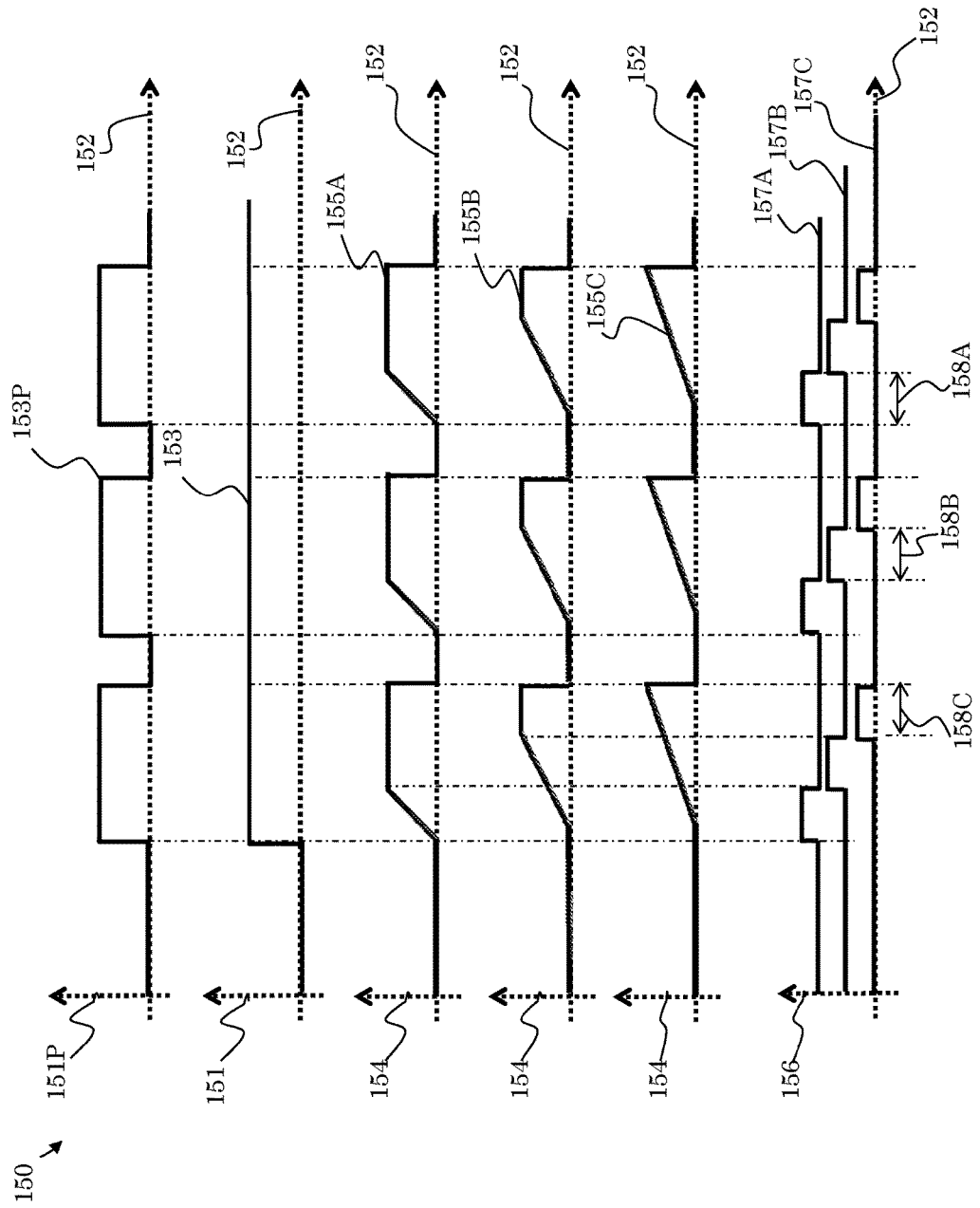
FIG. 1G depicts yet another example of a timing diagram for sampling spectral data with the optoelectronic module depicted in FIGS. 1A and 1B.
Figure 1H:
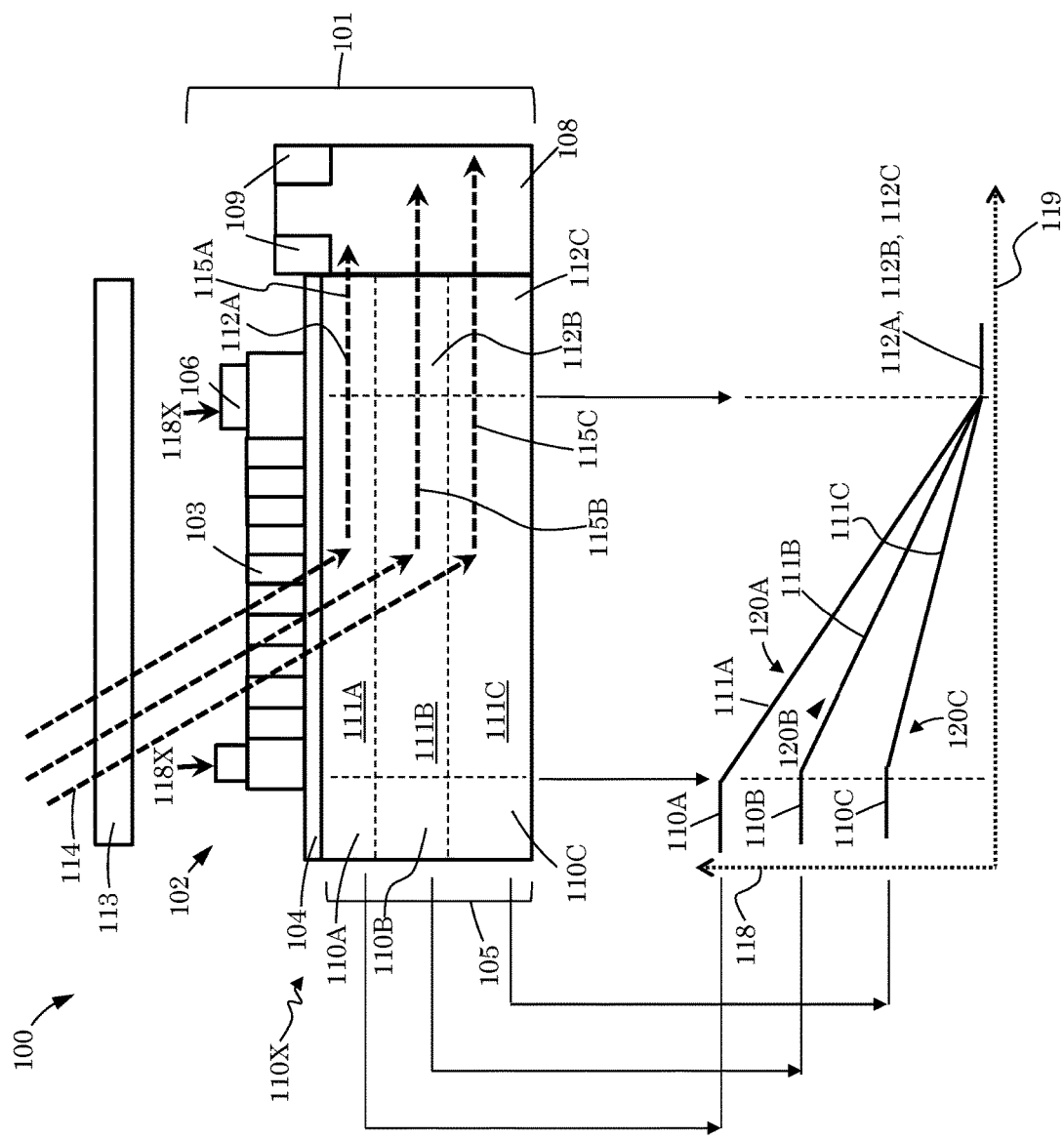
FIG. 1H depicts another cross-sectional view of an optoelectronic module and a plurality of drift-field potential regions for the acquisition of spectral data.

FIG. 1G depicts yet another example of a timing diagram for sampling spectral data with the optoelectronic module depicted in FIG. 1A and 1B. The timing diagram 150 depicts a drift-field digital logic level 151P on the y-axis and time 152 on the x-axis of a plot depicting a modulated drift-field profile 153P. The timing diagram 150 further depicts a light source power or intensity 151 on the y-axis and time 152 on the x-axis of a plot depicting a multi-wavelength light source profile 153. In this example, the multi-wavelength light source profile 153 represents the intensity of the multi-wavelength electromagnetic radiation 114 incident on the photo-sensitive detection region 102 with a constant intensity (or power, as discussed above). The timing diagram 150 further depicts a photo-current magnitude 154 on the y-axis and time 152 on the x-axis of a plot depicting a first photo-current profile 155A. The first photo-current profile 155A corresponds to the first photo-generated charges 115A under the influence of the first potential profile 120A with a respective drift velocity depicted in FIG. 1B. The timing diagram 150 further depicts a second photo-current profile 155B. The second photo-current profile 155B corresponds to the second photo-generated charges 115B under the influence of the second potential profile 120B with a respective drift velocity depicted in FIG. 1B. Still further the timing diagram 150 further depicts a third photo-current profile 155C. The third photo-current profile 155C corresponds to the third photo-generated charge 115C under the influence of the third potential profile 120C with a respective drift velocity depicted in FIG. 1B. The timing diagram 150 also depicts a digital logic level 156 on the y-axis and time 152 on the x-axis of a plot depicting a first sampling period profile 157A, a second sampling period profile 157B, and a third sampling period profile 157C. Each sampling period profile 157A, 157B, and 157C corresponds to the respective first photo-current profile 155A, second photo-current profile 155B, and third photo-current profile 155C. Further, each sampling period profile 157A, 157B, and 157C has a corresponding first sampling period 158A, second sampling period 158B, and third sampling period 158C, respectively. Each first sampling period 158A, second sampling period 158B, and third sampling period 158C can be of the same or different duration.

The timing diagram 150 depicted in FIG. 1G illustrates an example of how spectral data can be sampled given multi-wavelength electromagnetic radiation 114 incident on the photo-sensitive detection region 102 of a particular characteristic. In this example, the multi-wavelength electromagnetic radiation 114, as represented by multi-wavelength light source profile 153 is substantially constant in intensity (or power as discussed above) over the depicted duration. However, the modulated drift-field profile 153P is modulated. The modulated drift-field profile 153P represents an example of a manner in which the respective first potential profile 120A, second potential profile 120B, and third potential profile 120C as depicted in FIG. 1A and FIG. 1B can be modulated such that the respective drift velocities associated with the respective first photo-generated charges 115A, second photo-generated charges 115B, and third photo-generated charges 115C are also modulated. Thereby permitting the respective first photo-current profile 155A, the second photo-current profile 155B, and the third photo-current profile 155C to be characterized by non-steady regions of respective photo-currents (each corresponding to respective pluralities of photo-generated charges 115A, 115B, and 115C), wherein the non-steady regions of respective photo-currents are repeatable at regular intervals (e.g., at a frequency substantially similar to the modulation frequency of the modulated drift-field profile 153P). Accordingly, each first sampling period profile 157A, second sampling period profile 157B, and third sampling period profile 157C can have repeating first sampling periods 158A, second sampling periods 158B, and third sampling periods 158C with advantages as described above.

A further advantage of this implementation is that the multi-wavelength electromagnetic radiation 114 incident on the photo-sensitive detection region 102 need not be modulated in order to obtain a repeating non-steady photo-current regions in each first photo-current profile 155A, second photo-current profile 155B, and third photo-current profile 155C, which as discussed above has a number of advantages for the acquisition of accurate spectral data. Further, as described above, the alternate plurality of potential profiles 120 as depicted in FIG. 1E and FIG. 1F can further be employed in the implementation described in FIG. 1G. For example, while the modulated drift-field profile 153P is might be operable to modulate the drift-fields in the semiconductor substrate 105 in order to conduct photo-generated charges to the charge-collection region 108 as depicted in FIG. 1E. In other instances the modulated drift-field profile 153P might be operable to alternatively drain charge from the semiconductor substrate 105 according to the potential profiles 120 depicted in FIG. 1F. Such implementations share the advantages of other implementations discussed above.

In some implementations, spatially varying charge-carrier mobilities can be used to acquire spectral data. Charge-carrier mobility can be described according to the following:

$$\mu = \frac{q}{m^*} \bar{\tau}$$

where q is charge, m* is the charge-carrier effective mass, and $\bar{t}$ is the average scattering time. The effective mass can be dependent on the band structure of the semiconductor substrate (e.g., semiconductor substrate 105). Further the average scattering time can be dependent on a number of factors, such as phonon scattering, impurity scattering, and defect scattering. These can be modified to provide spatially varying charge-carrier mobility and are within the scope of this disclosure. For example, the effective mass can be modified according to the bonding characteristics of constituent elements within the semiconductor material. Appropriate doping and/or bonding and/or other structural modifications (herein crystallographic modifications) can be used to provide charge-carrier effective masses that vary over a spatial dimension of the semiconductor material. In other examples, the average scattering time can be modified according to the aforementioned crystallographic modifications and further; for example, when the semiconductor substrate is a polycrystalline semiconductor material; the average scattering time can be modified with appropriate defects such as dislocations, and/or nano-sized inclusions, and/or polycrystalline-grain-boundary tuning (herein microstructural modifications). Accordingly, various implementations employing spatially varying effective mass and spatially varying scattering times can be exploited to acquire spectral data.

Figure 2A:
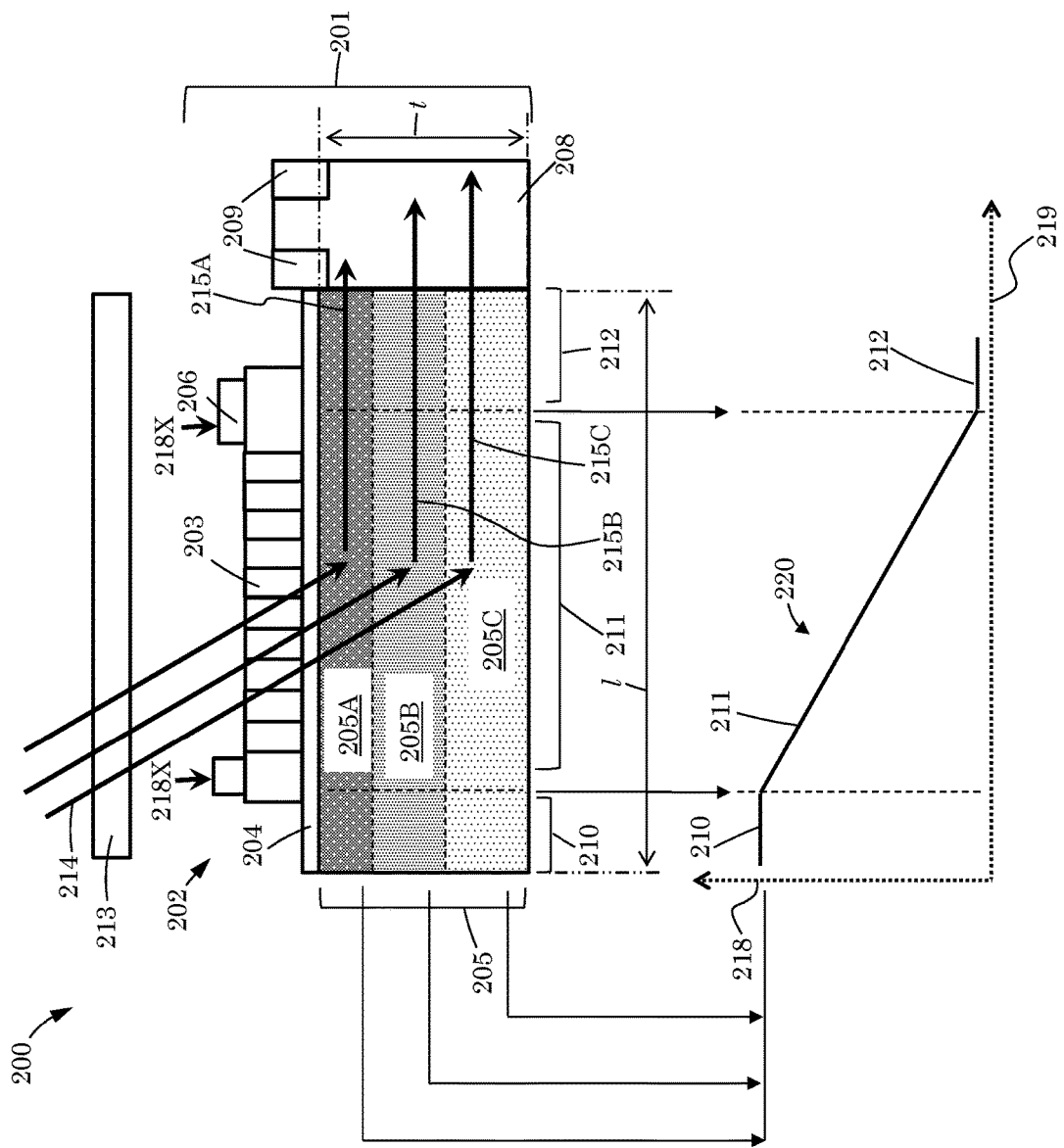
FIG. 2A depicts a cross-sectional view of another example optoelectronic module with a plurality of charge-carrier mobility regions and a respective drift-field potential for the acquisition of spectral data.

For example, FIG. 2A depicts a cross-sectional view of another example optoelectronic module 200 with a plurality of charge-carrier mobility regions and a respective drift-field potential profile for the acquisition of spectral data. In this example, spatially varying charge-carrier effective masses and/or spatially varying charge-carrier scattering times can be exploited to acquire spectral data. The optoelectronic module 200 includes a drift-field demodulation pixel 201 and in some implementations can further include a spectral filter 213. In other implementations the optoelectronic module 200 can include an array of demodulation pixels 201. The drift-field demodulation pixel 201 further includes a photo-sensitive detection region 202. In this implementation the drift-field demodulation pixel 201 further includes a plurality of gates 203, and insulator layer 204, a semiconductor substrate 205, and a plurality of contact nodes 206.

The semiconductor substrate 205 has a thickness t and a lateral dimension l. In some cases, the lateral dimension l can be considerably larger in magnitude than the thickness t. The semiconductor substrate 205 can be composed of silicon, for example, and can be further doped with appropriate dopants. However, other semiconductors materials can be used in other implementations and are within the scope of this disclosure. For example, in some implementations, semiconductor substrate 205 can be derived from the Group 13-Group 17 elements (and/or combinations thereof) in order to achieve, for example, particular charge-carrier concentrations, spectral sensitivities, and/or charge-carrier mobilities. Still further, semiconductor substrate 205 can be single crystalline, polycrystalline, and/or a crystalline and/or polycrystalline nanocomposite. Further, in this implementation each respective gate within the plurality of gates 203 can be adjacent and electrically isolated from each other.

Potentials 218X can be applied to the plurality of contact nodes 206 via electrodes 207. The applied potentials 218X can generate a plurality of potential regions 210X within the semiconductor substrate 205; that is, a plurality of respective drift-field regions. The drift-field demodulation pixel 201 further includes a charge-collection region 208 (e.g., a charge demodulation region) and a plurality of output nodes 209. Multi-wavelength electromagnetic radiation 214 can be incident on the drift-field demodulation pixel 201. Multi-wavelength electromagnetic radiation 214 can be generated by an emitter (e.g., an emitter implemented in coordination with and/or as part of the optoelectronic module 200 such as a modulated light source and/or a flash and/or a modulated flash); however, in other implementations multi-wavelength electromagnetic radiation 214 can be generated by ambient light (e.g., natural or artificial lighting in a scene). The multi-wavelength electromagnetic radiation 214 can be any composition of wavelengths (e.g., from infrared to visible to ultraviolet). In some implementations optoelectronic module 200 further includes a spectral filter 213. The spectral filter 213 can be useful in some cases to block or substantially attenuate particular ranges of wavelengths of electromagnetic radiation. For example, in some implementations infrared radiation may be blocked or substantially attenuated, while in other implementations ultraviolet radiation may be blocked or substantially attenuated. The multi-wavelength electromagnetic radiation 214 incident on the drift-field demodulation pixel 201, and consequently, the photo-sensitive detection region 202 can generate photo-generated charges 215 in the semiconductor substrate 205. In some implementations each potential region within the plurality of potential regions 210X can vary with, for example, the thickness t of the semiconductor substrate 205. However, the potential region 210X are depicted to vary linearly in the example depicted in FIG. 2A. In contrast to the depiction of the optoelectronic module 100 depicted in FIG. 1A and FIG. 1B, the optoelectronic module 200 depicted in FIG. 2A further includes a first mobility region 205A, a second mobility region 205B, and a third mobility region 205C. The mobility regions 205A, 205B, and 205C are obtained as outlined above (e.g., via crystallographic and/or microstructural modifications).

As mentioned above a plurality of potential profiles are possible in some implementations; however, only a single uniform drift-field potential profile 220 is depicted in FIG. 2A (the lower portion of the diagram). A plurality of mobility regions spanning the lateral dimension l are within the scope of this disclosure. In the implementation only three mobility regions are depicted (i.e., the first mobility region 205A, the second mobility region 205B, and the third mobility region 205C); however, more or fewer discrete potential profiles can be included in other implementations. Moreover, the plurality of mobility regions need not be discrete but rather can vary continuously (e.g., with the thickness t of the semiconductor substrate 205).

Further, the applied potentials 218X can generate a plurality of potential regions 210X where the drift field within the semiconductor substrate 205 can vary laterally with the lateral dimension l of the semiconductor substrate 205. For example, the potential regions 210X can include a high-potential region 210, a drift-field potential region 211, and a low-potential region 212. Further, since the drift-field can also vary with the thickness t of the semiconductor substrate 205 (though not depicted in FIG. 2A) the potential regions 210X can further include a potential regions that vary along the thickness t of the semiconductor substrate 205. In this implementation the uniform drift-field potential profile 220 can laterally span (or intersect) the high-potential region 210, the drift-field region 211, and a low-potential region 212.

Generally, the potential regions 210X can facilitate the conduction of the plurality of photo-generated charges 215 into the charge-collection region 208 so that a signal can be sampled at the output nodes 209 (e.g., where in some cases the sample can be demodulated at the charge-collection region 208). Further, the potential regions 210X can dump the plurality of photo-generated charges 215 when it becomes necessary to drain excess or unwanted charge from the drift-field demodulation pixel 201.

Since in some implementations the mobilities regions can vary with thickness t of the semiconductor substrate 205 (i.e., first mobility region 205A, second mobility region 205B and third mobility region 205C in this implementation), and different wavelengths within the multi-wavelength electromagnetic radiation 214 incident on the photo-sensitive detection region 202 can penetrate the semiconductor substrate 205 to different depths, then the photo-generated charges 215 (i.e., first photo-generated charges 215A, second photo-generated charges 215B, third photo-generated charges 215C in the implementation depicted din FIG. 2A) generated at different depths can be associated with different portions of the multi-wavelength electromagnetic radiation 214. Accordingly, since the plurality of mobility regions 205A, 205B, and 205C are distributed over a range of depths in this implementation, then the photo-generated charges 215 generated at different depths can have respective drift velocities. For example, in the implementation depicted in FIG. 2A different portions of the multi-wavelength electromagnetic radiation 214 can penetrate the semiconductor substrate 205 to different depths (e.g., ranges of wavelengths of the multi-wavelength electromagnetic radiation 214 primarily corresponding to red light can penetrate to the third mobility region 205C, ranges of wavelengths of the multi-wavelength electromagnetic radiation 214 primarily corresponding to green light can penetrate to the second mobility region 205B, and ranges of wavelengths of the multi-wavelength electromagnetic radiation 214 primarily corresponding to blue light can penetrate to the first mobility region 205A). Accordingly, first photo-generated charges 215A, second photo-generated charges 215B, and third photo-generated charge 215C can primarily correspond to respective portions of the multi-wavelength electromagnetic radiation 214, blue, green, and red in this example.

Still further, as each of the first photo-generated charges 215A, the second photo-generated charges 215B, and the third photo-generated charges 215C are subjected to the uniform drift-field potential profile 220, then each has a respective drift velocity 216A, 216B, and 216C dictated in part by the differing respective mobility regions 205A, 205B, and 205C, respectively. Since the photo-generated charges 215A, 215B, 215C have respective drift velocities, and in this implementation each respective drift velocity is different, then the photo-generated charges 215A, 215B, and 215C will arrive at the charge-collection region 208 at different points in time. Accordingly, signals, each associated with the respective photo-generated charges 215A, 215B, and 215C can be sampled at different times and can be associated with the different portions of the multi-wavelength electromagnetic radiation 214 incident on the photo-sensitive detection region 202. Consequently, spectral data such as the composition of the multi-wavelength electromagnetic radiation 214 can be determined (e.g., the wavelengths and/or wavelength ranges and their respective intensities can be determined).

The lower part of FIG. 2A depicts a potential or drift-field magnitude 218 on the y-axis and a lateral dimension or coordinate 219 on the x-axis of a plot depicting the uniform drift-field potential profile 220. As depicted, the uniform drift-field potential profile 220 varies from a high potential to a low potential (from left to right). Moreover, the plurality of potential regions 210X are also depicted. The high-potential region 210, the drift-field region 211, the low-potential region 212 are also depicted.

Figure 2B:
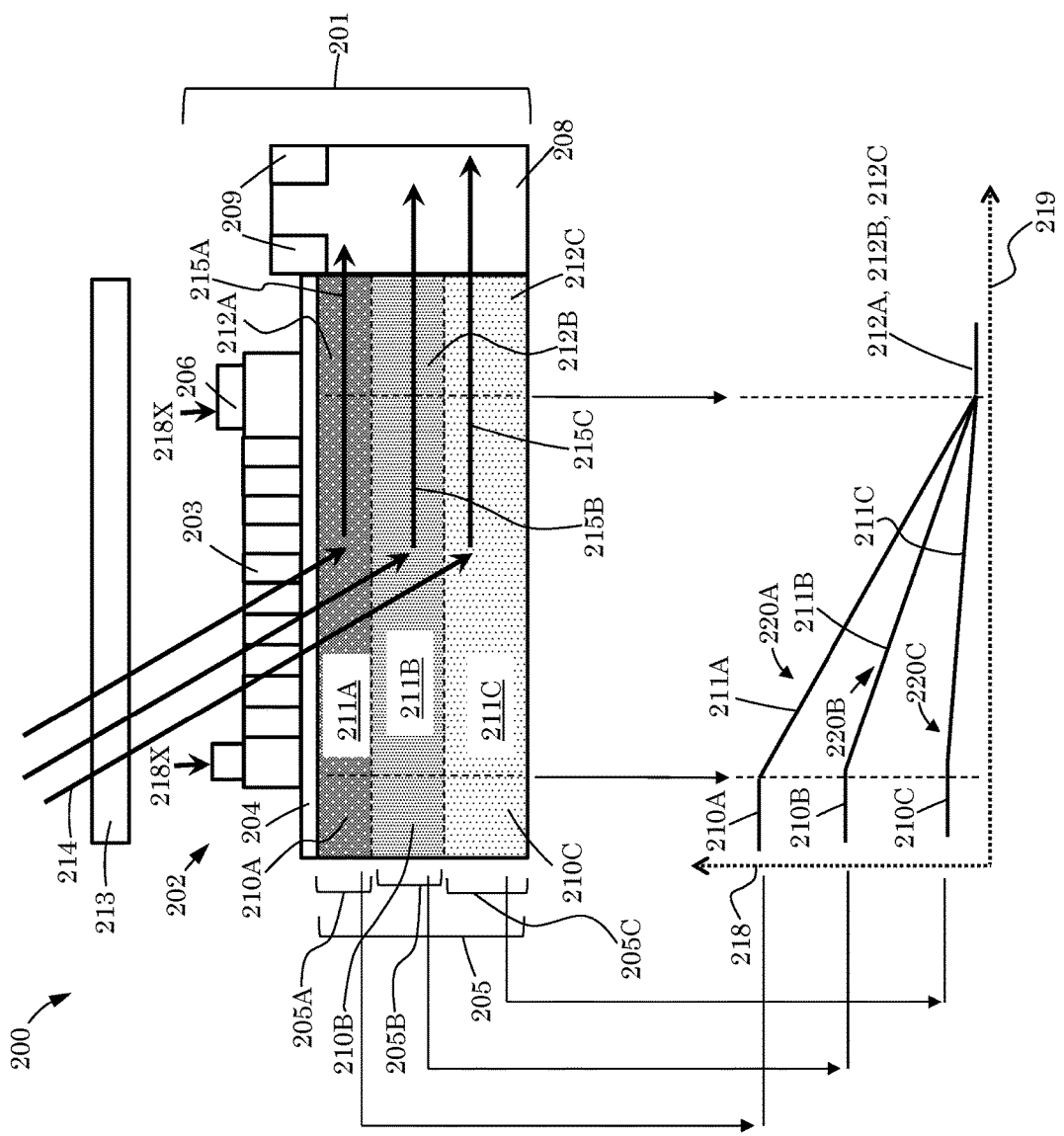
FIG. 2B depicts a cross-sectional view of another example optoelectronic module with a plurality of charge-carrier mobility regions and a plurality of drift-field potential profiles for the acquisition of spectral data.

FIG. 2B depicts a cross-sectional view of another example optoelectronic module with a plurality of charge-carrier mobility regions and a plurality of drift-field potential profiles for the acquisition of spectral data. In this example, spatially varying charge-carrier effective masses and/or spatially charge-carrier scattering times and additional spatially varying drift-fields can be exploited to acquire spectral data in a similar way as depicted in FIG. 1A-FIG. 1H. In some implementations, combining a plurality of charge-carrier mobility regions and a plurality of drift-field potential profiles can permit greater accuracy or greater sensitivity of spectral data acquisition.

Figure 2C:
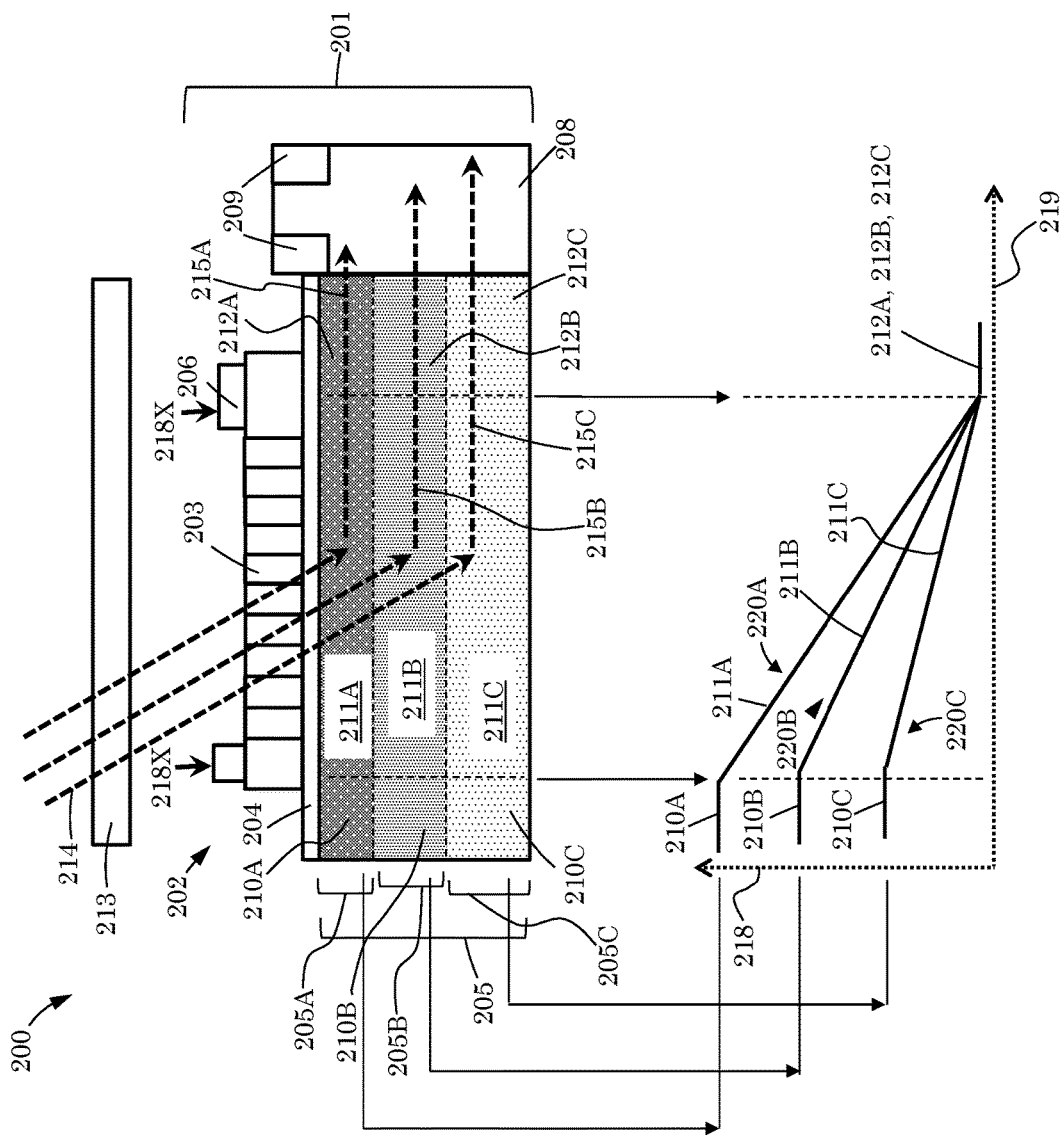
FIG. 2C depicts a cross-sectional view of another example optoelectronic module with a plurality of charge-carrier mobility regions and a plurality of drift-field potential profiles for the acquisition of distance data.

FIG. 2C depicts a cross-sectional view of another example optoelectronic module with a plurality of charge-carrier mobility regions and a plurality of drift-field potential profiles for the acquisition of distance data. The optoelectronic module 200 is operable in a similar way to the previous implementations described above. However, when the optoelectronic module 200 is operable to acquire distance data, the magnitude of the drift-field potentials can increase (as depicted in the lower part of FIG. 2C) such that photo-generated charge carriers are conducted more rapidly to the charge-collection region 208. This implementation can provide various advantages; for example, distance data can be acquired more rapidly and therefore optoelectronic module 200 can be used for real time or near-real time applications.

FIG. 3A depicts a plan view of an example optoelectronic module for the acquisition of both distance data and spectral data including an example of an emitter. In this example implementation an optoelectronic module 300 includes a drift-field demodulation pixel 301 (as described in the previous implementations above) and an emitter 341 (e.g., a light-emitting diode, a vertical-cavity surface-emitting laser, or other illumination device). The emitter can be operable to generate electromagnetic radiations 314. Further the emitter 341 can include an optical assembly for projecting or focusing electromagnetic radiation generated by the emitter 341. Further, the emitter can be operable to emit electromagnetic radiation with the characteristics of the multi-wavelength electromagnetic radiation 114 and multi-wavelength electromagnetic radiation 214 as described in the implementations above. The drift-field demodulation pixel 301 and the emitter 341 can be electrically connected to a substrate 360 (such as a PCB or a silicon wafer). The optoelectronic module 300 further includes an optical assembly 370. The optical assembly 370 includes an optical element 371 or a plurality of optical elements 371, each mounted in an optical housing 372.

FIG. 3B depicts a cross-sectional view of the example optoelectronic module depicted in FIG. 3A for the acquisition of both distance data and spectral data including an example of an emitter.

Various modifications can be made to the foregoing implementations. For example, various implementations described above included a drift-field demodulation pixel; however, some implementations can include another kind of pixel, for example, a silo pixel or any other type of pixel as would be apparent to a person of ordinary skill in the art. Combinations of the various features described above are within the scope of this disclosure. Accordingly, other implementations are within the scope of the claims.

What is claimed:

1. An optoelectronic module operable to capture distance data and spectral data, the optoelectronic module comprising:
    a drift-field demodulation pixel having a photo-sensitive detection region, gates, an insulator layer, a semiconductor substrate with a thickness and lateral dimension, a charge-collection region, and contact nodes, wherein the drift-field demodulation pixel is operable such that potentials applied to the contact nodes generate potential regions that vary in magnitude with the lateral dimension of the semiconductor substrate;
    the drift-field demodulation pixel being operable to generate photo-generated charges from multi-wavelength electromagnetic radiation incident on the photo-sensitive detection region, wherein respective portions of the multi-wavelength electromagnetic radiation incident on the photo-sensitive detection region generate corresponding portions of the photo-generated charges;
    the potential regions within the semiconductor substrate being operable to conduct the photo-generated charges from the photo-sensitive detection region to the charge-collection region; and
    the corresponding portions of the photo-generated charges being conducted to the charge-collection region with respective drift velocities that vary in magnitude with the thickness of the semiconductor substrate.

2. The optoelectronic module of claim 1, the potential regions further comprising a high-potential region, a drift-field region, and a low-potential region.

3. The optoelectronic module of claim 1, the potential regions further comprising a charge-dump region, a drift-field region, and a low-potential region.

4. The optoelectronic module of claim 1, the semiconductor substrate further comprising mobility regions intersecting the potential regions and varying with the thickness of the semiconductor substrate.

5. The optoelectronic module of claim 4, wherein each mobility region further comprises a respective dopant.

6. The optoelectronic module of claim 4, wherein each mobility region further comprises a respective dopant concentration.

7. The optoelectronic module of claim 4, wherein each mobility region further comprises a respective crystallographic modification.

8. The optoelectronic module of claim 4, wherein each mobility region further comprises a respective microstructural modification.

9. The optoelectronic module according to claim 1, wherein the multi-wavelength electromagnetic radiation incident on the photo-sensitive detection region is modulated with an incident modulation frequency.

10. The optoelectronic module according to claim 1, the optoelectronic module further comprising an emitter operable to emit modulated multi-wavelength electromagnetic radiation with a modulation frequency.

11. The optoelectronic module according to claim 1, wherein each portion of photo-generated charges is sampled at the output nodes with respective sampling period profiles.

12. The optoelectronic module according to claim 11, wherein each sampling period profile further comprises a respective sampling initiation time, a respective sampling period, and a respective sampling frequency.

13. The optoelectronic module according to claim 12, wherein each sampling frequency substantially corresponds to the frequency of the incident modulation frequency.

14. The optoelectronic module according to claim 13, wherein a first portion of the photo-generated charges has a first drift velocity.

15. The optoelectronic module according to claim 14, wherein a second portion of the photo-generate charges has a second drift velocity.

16. The optoelectronic module according to claim 15, wherein a third portion of the photo-generate charges has a third drift velocity.

17. An optoelectronic module operable to capture distance data and spectral data, the optoelectronic module comprising:
a drift-field demodulation pixel having a photo-sensitive detection region, gates, an insulator layer, a semiconductor substrate with a thickness and lateral dimension, a charge-collection region, and contact nodes, wherein the drift-field demodulation pixel is operable such that potentials applied to the contact nodes generate potential regions that vary in magnitude with the lateral dimension of the semiconductor substrate, the potential regions further varying in magnitude with the thickness of the semiconductor substrate;
the drift-field demodulation pixel being operable to generate photo-generated charges from multi-wavelength electromagnetic radiation incident on the photo-sensitive detection region, wherein respective portions of the multi-wavelength electromagnetic radiation incident on the photo-sensitive detection region generate corresponding portions of the photo-generated charges;
the potential regions within the semiconductor substrate being operable to conduct the photo-generated charges from the photo-sensitive detection region to the charge-collection region; and
the corresponding portions of the photo-generated charges being conducted to the charge-collection region with respective drift velocities that vary in magnitude with the thickness of the semiconductor substrate.

18. The optoelectronic module of claim 17, the potential regions varying continuously in magnitude with the thickness of the semiconductor substrate.

19. The optoelectronic module of claim 18, the potential regions having a maximum potential in close proximity to the insulator layer.

20. The optoelectronic module of claim 18, wherein the potential regions vary substantially polynomially in magnitude with the thickness of the semiconductor substrate, potential regions having maximum potentials in close proximity to the insulator layer.

* * * * *